United States Patent

Matsumoto

(10) Patent No.: US 9,159,555 B2
(45) Date of Patent: Oct. 13, 2015

(54) MULTI CHARGED PARTICLE BEAM WRITING APPARATUS AND MULTI CHARGED PARTICLE BEAM WRITING METHOD

(71) Applicant: NuFlare Technology, Inc., Numazu-shi (JP)

(72) Inventor: Hiroshi Matsumoto, Shizuoka (JP)

(73) Assignee: NuFlare Technology, Inc., Numazu-shi (JP)

(*) Notice: Subject to any disclaimer, the term of this patent is extended or adjusted under 35 U.S.C. 154(b) by 405 days.

(21) Appl. No.: 13/798,669

(22) Filed: Mar. 13, 2013

(65) Prior Publication Data

US 2013/0253688 A1 Sep. 26, 2013

(30) Foreign Application Priority Data

Mar. 22, 2012 (JP) ................................ 2012-065387

(51) Int. Cl.
*H01J 3/07* (2006.01)
*H01J 29/51* (2006.01)
*H01J 37/26* (2006.01)
*H01L 21/02* (2006.01)
*G03F 7/20* (2006.01)
*H01J 37/317* (2006.01)
*B82Y 10/00* (2011.01)
*B82Y 40/00* (2011.01)

(52) U.S. Cl.
CPC ........... *H01L 21/02675* (2013.01); *B82Y 10/00* (2013.01); *B82Y 40/00* (2013.01); *G03F 7/2059* (2013.01); *H01J 37/3177* (2013.01); *H01J 2237/30433* (2013.01); *H01J 2237/30455* (2013.01); *H01J 2237/31794* (2013.01)

(58) Field of Classification Search
CPC ................... H01J 37/3177; H01J 2237/0453; H01J 2237/24535; H01J 2237/30433; H01J 2237/30455
USPC .......... 250/306, 307, 310, 311, 396 R, 492.2, 250/492.3, 397; 430/296
See application file for complete search history.

(56) References Cited

U.S. PATENT DOCUMENTS

| | | | | |
|---|---|---|---|---|
| 4,694,178 | A * | 9/1987 | Harte | ........................ 250/396 R |
| 6,969,862 | B2 | 11/2005 | Muraki et al. | |
| 7,388,214 | B2 | 6/2008 | Maeda | |
| 2013/0252172 | A1* | 9/2013 | Matsumoto | ................... 430/296 |
| 2013/0320230 | A1* | 12/2013 | Yoshikawa et al. | ........... 250/398 |

FOREIGN PATENT DOCUMENTS

| | | |
|---|---|---|
| JP | 2914926 | 4/1999 |
| JP | 2006-261342 | 9/2006 |

* cited by examiner

*Primary Examiner* — Nikita Wells
(74) *Attorney, Agent, or Firm* — Oblon, McClelland, Maier & Neustadt, L.L.P.

(57) ABSTRACT

A multi charged particle beam writing apparatus includes a unit to calculate a predetermined function expression by a correction coefficient that corrects an open area of each opening for forming a beam group, wherein the predetermined function expression minimizes a sum of squared values of all the beam groups, where each of the squared values is calculated by squaring a difference between a current value measured of the beam group and a sum of products for the beam group, where each of the products is obtained by multiplying a corrected open area by the predetermined function expression; a unit to calculate the correction coefficient that corrects the open area by using the predetermined function expression and the current value of the beam, for each beam; and a unit to calculate a current density of each of the multiple beams by the predetermined function expression.

10 Claims, 10 Drawing Sheets

MULTI CHARGED PARTICLE BEAM WRITING APPARATUS AND MULTI CHARGED PARTICLE BEAM WRITING METHOD

CROSS-REFERENCE TO RELATED APPLICATION

This application is based upon and claims the benefit of priority from the prior Japanese Patent Application No. 2012-065387 filed on Mar. 22, 2012 in Japan, the entire contents of which are incorporated herein by reference.

BACKGROUND OF THE INVENTION

1. Field of the Invention

The present invention relates to a multi charged particle beam writing apparatus and a multi charged particle beam writing method. For example, the present invention relates to a method of obtaining high accuracy of multi-beam writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with an electron beam.

As an example using the electron beam writing technique, there is a writing apparatus using multiple beams (multi-beams). Compared with the case of writing using a single electron beam, since a multi-beam writing apparatus can emit multiple radiation beams at a time, it is possible to greatly increase the throughput. In such a writing apparatus of a multi-beam system, for example, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Patent Application Laid-open (JP-A) No. 2006-261342).

In order to maintain writing accuracy, it is required to calibrate the amount of beam current. In the single beam system, especially in the variable shaping system, since the shot size varies by shot, what is necessary is just to adjust the current density of a beam to be uniform. On the other hand, in the multi-beam system, unlike the single beam system, since the variable shaping is not performed and the shot size of each beam is fixed to be the same size, it is necessary to perform adjustment so that each current amount may be constant. In order to maintain writing accuracy, the beam current amount needs to be calibrated. In the single beam system, since the beam area to be used as a shot in a beam emitted from the electron gun assembly is small, the current density in this area can be almost uniform. However, since many beams in a large area are used in the multi-beam system, it is difficult to make each current uniform. Therefore, it is necessary to correct the irradiation time according to variation of the current amount of each of multiple beams.

In the single beam system, the amount of beam current can be measured by applying irradiation of a beam to the Faraday cup on the stage. Since only one beam is used in the single beam system, measuring can be performed before and after writing processing. However, unlike the single beam system, since a large number of beams are used in the multi-beam system, it may take several days to measure all of the current value of each beam by using the Faraday cup on the stage. Therefore, the writing processing is stopped during the measurement, thereby causing problems of reduction of the apparatus operation rate and reduction of the writing throughput.

Moreover, current density distribution of multiple beams may always change due to temporal change of the cathode of a beam emission source, such as an electron gun assembly, therefore, there is a problem that the current amount of each of the multiple beams will also change.

BRIEF SUMMARY OF THE INVENTION

In accordance with one aspect of the present invention, a multi charged particle beam writing apparatus includes a beam group current measurement unit configured to measure a current value of each beam group of a plurality of beam groups, where the each beam group is per region of a plurality of regions obtained by dividing a multi-beam formation region, wherein multiple beams, respectively having passed through a corresponding opening of a plurality of openings of an aperture member in which the plurality of openings are provided to form the multiple beams by being irradiated with a charged particle beam, are separated into the plurality of beam groups; a function expression calculation unit configured to calculate a predetermined function expression by using a correction coefficient which corrects an open area of each opening for forming a beam group concerned of the plurality of beam groups, wherein the predetermined function expression minimizes a sum of squared values of all the plurality of beam groups, where each of the squared values is calculated by squaring a difference between the current value of the beam group concerned and a sum of products for the beam group concerned, where each of the products is obtained by multiplying the open area having been corrected by the correction coefficient for the each opening for forming the beam group concerned by the predetermined function expression; an individual beam current value measurement unit configured to measure a current value of each beam of the multiple beams during between writing processing; a correction coefficient calculation unit configured to calculate the correction coefficient which corrects the open area of the each opening for forming a beam concerned of the multiple beams by using the predetermined function expression and the current value of the beam concerned, for the each beam of the multiple beams; an updating unit configured to update the correction coefficient for the beam concerned, for the each beam of the multiple beams; a current density calculation unit configured to calculate a current density of the each beam of the multiple beams by using the predetermined function expression; an irradiation time calculation unit configured to calculate an irradiation time of the each beam by using the current density of the each beam; and a writing unit configured to write a pattern on a target object by irradiating the each beam during the irradiation time calculated.

In accordance with another aspect of the present invention, a multi charged particle beam writing method includes measuring a current value of each beam group of a plurality of beam groups, where the each beam group is per region of a plurality of regions obtained by dividing a multi-beam formation region, wherein multiple beams, respectively having passed through a corresponding opening of a plurality of openings of an aperture member in which the plurality of openings are provided to form the multiple beams by being irradiated with a charged particle beam, are separated into the plurality of beam groups; calculating a predetermined function expression by using a correction coefficient which corrects an open area of each opening for forming a beam group concerned of the plurality of beam groups, wherein the predetermined function expression minimizes a sum of squared values of all the plurality of beam groups, where each of the squared values is calculated by squaring a difference between the current value of the beam group concerned and a sum of products for the beam group concerned, where each of the products is obtained by multiplying the open area having been corrected by the correction coefficient for the each opening for forming the beam group concerned by the predetermined function expression; calculating a current density of the each beam of the multiple beams by using the predetermined function expression; calculating an irradiation time of the each beam by using the current density of the each beam; writing a pattern on a target object by irradiating the each beam during the irradiation time calculated; measuring a current value of each beam of the multiple beams during between writing processing; calculating a correction coefficient which corrects an open area of each opening for forming a beam concerned of the multiple beams by using the predetermined function expression and the current value of the beam concerned, for the each beam of the multiple beams; and updating the correction coefficient for the beam concerned, for the each beam of the multiple beams.

DETAILED DESCRIPTION OF THE INVENTION

In the following Embodiment, there will be described a writing apparatus and method capable of calibrating a current amount of each of multiple beams without reducing the throughput.

Moreover, in the following Embodiment, there will be described a structure in which an electron beam is used as an example of a charged particle beam. However, the charged particle beam is not limited to the electron beam, and other charged particle beam, such as an ion beam, may also be used.

Embodiment 1

Figure 1:
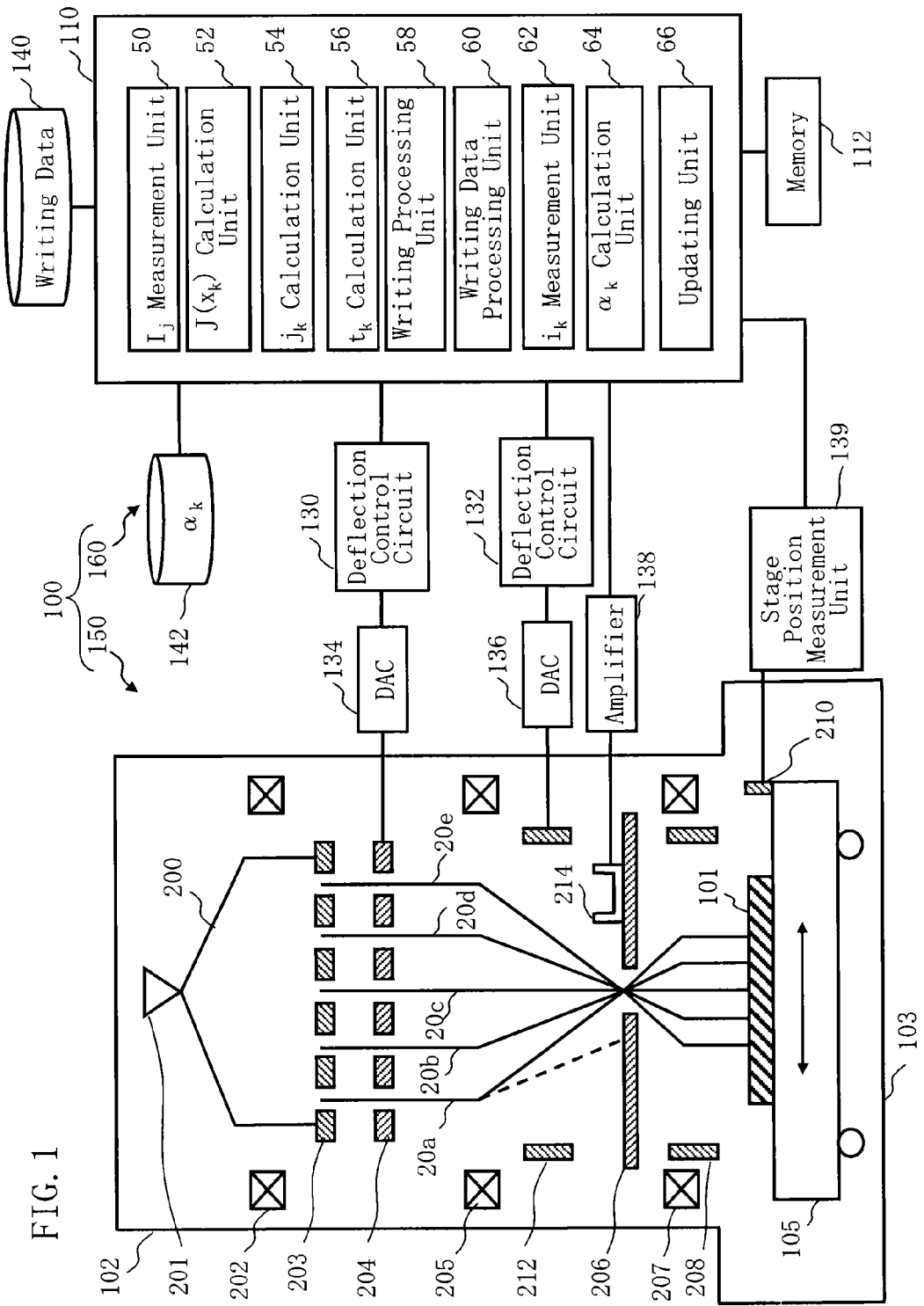
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a deflector 212, a limiting aperture member 206, an objective lens 207, and a deflector 208. In the writing chamber 103, there is arranged an XY stage 105, on which a target object or "sample" 101 such as a mask serving as a writing target substrate is placed. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, there is arranged a mirror 210 for measuring a position of the XY stage 105. Moreover, a current detector 214 is arranged at the limiting aperture member 206.

In the example of FIG. 1, the current detector 214 is arranged on the limiting aperture member 206 at a different position from the restriction opening of the limiting aperture member 206, however it is not limited thereto. It is also preferable that another opening is provided at a different position from the restriction opening of the limiting aperture member 206 and the current detector 214 is arranged below this opening.

The control unit 160 includes a control computer 110, a memory 112, deflection control circuits 130 and 132, digital-to-analog converter (DAC) amplifiers 134 and 136, an amplifier 138, a stage position measurement unit 139, and storage devices 140, and 142, such as magnetic disk drives. The control computer 110, the memory 112, the deflection control circuits 130 and 132, the amplifier 138, the stage position measurement unit 139, and the storage devices, 140, and 142 are mutually connected through a bus (not shown). Writing data is input into the storage device 140 (storage unit) from the outside to be stored therein.

In the control computer 110, there are arranged a beam group current measurement unit 50, a function $J(x_k)$ calculation unit 52, a current density calculation unit 54, a writing time calculation unit 56, a writing processing unit 58, a writing data processing unit 60, an individual beam current measurement unit 62, a correction coefficient calculation unit 64, and an updating unit 66. Then, each function of them may be configured by hardware such as an electronic circuit, or by software such as a program implementing these functions. Alternatively, they may be configured by a combination of software and hardware. Data which is input and output to/from the beam group current measurement unit 50, the function $J(x_k)$ calculation unit 52, the current density calculation unit 54, the writing time calculation unit 56, the writing processing unit 58, the writing data processing unit 60, the individual beam current measurement unit 62, the correction coefficient calculation unit 64, and the updating unit 66, and data being calculated are stored in the memory 112 each time.

As described above, FIG. 1 shows a structure necessary for explaining Embodiment 1. Other structure elements generally necessary for the writing apparatus 100 may also be included.

Figure 2A:
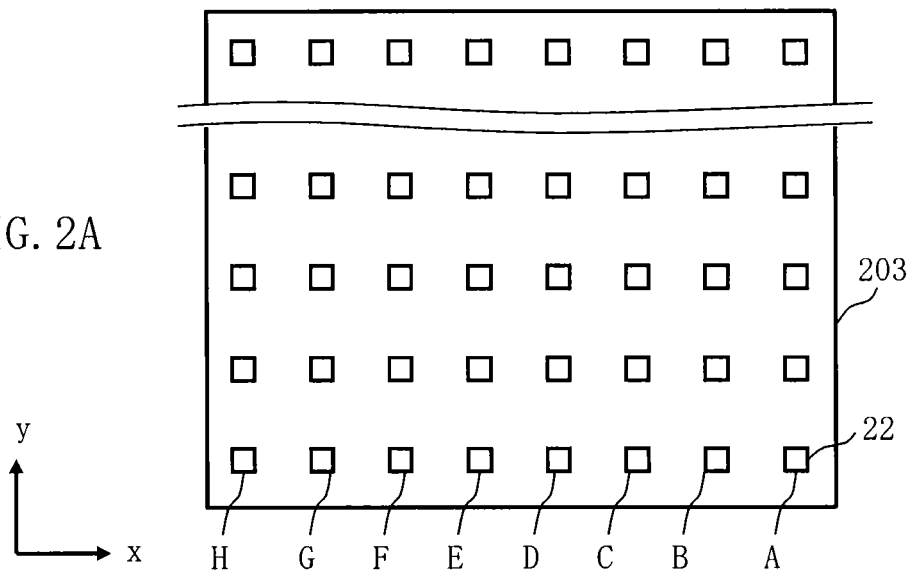
FIGS. 2A and 2B are schematic diagrams each showing the configuration of an aperture member according to Embodiment 1.
Figure 2B:
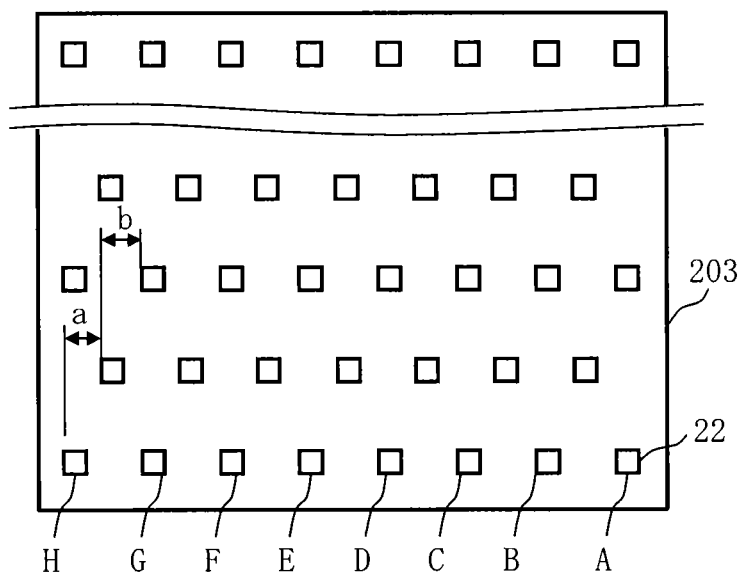

FIGS. 2A and 2B are schematic diagrams each showing an example of the configuration of an aperture member according to Embodiment 1. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 has the same dimension and shape of a quadrangle. Alternatively, each hole may be a circle of the same circumference. In this case, there is shown an example of each row having eight holes 22 from A to H in the x direction. Multi-beams 20 are formed by letting parts of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
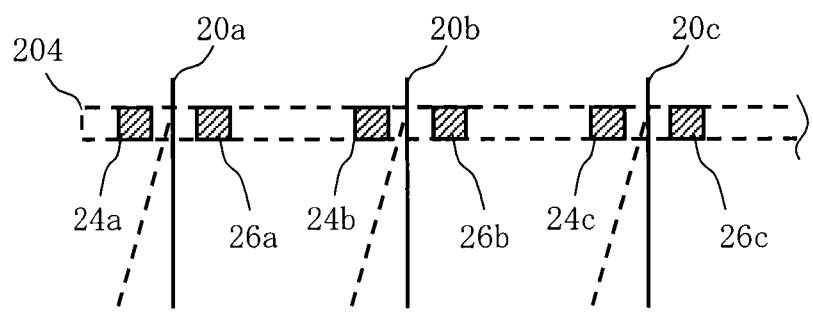
FIG. 3 is a schematic diagram showing the configuration of a blanking plate according to Embodiment 1.

FIG. 3 is a schematic diagram showing the configuration of a blanking plate according to Embodiment 1. In the blanking plate 204, a passage hole is formed to be corresponding to the arrangement position of each hole 22 of the aperture member 203, and a pair of electrodes 24 and 26 (blanker: the first deflector) is arranged for each passage hole. The electron beams 20 (multiple beams) respectively passing through a corresponding passage hole are respectively deflected by the voltage applied to the two electrodes 24 and 26 being a pair, and blanking control is performed by this deflection. Thus, a plurality of blankers respectively perform blanking deflection of a corresponding beam in the multiple beams having passed through a plurality of holes 22 (openings) of the aperture member 203.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector) of the blanking plate 204. Each blanker deflects (performs blanking deflection) each of the electron beams 200 passing respectively. The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam.

Thus, the limiting aperture member 206 blocks each beam which was deflected to be in the "beam off" state by each of a plurality of blankers. Then, one beam shot is formed by beams which have been formed during from the "beam on" state to the "beam off" state and have passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be "beam on" according to a pattern.

Figure 4A:
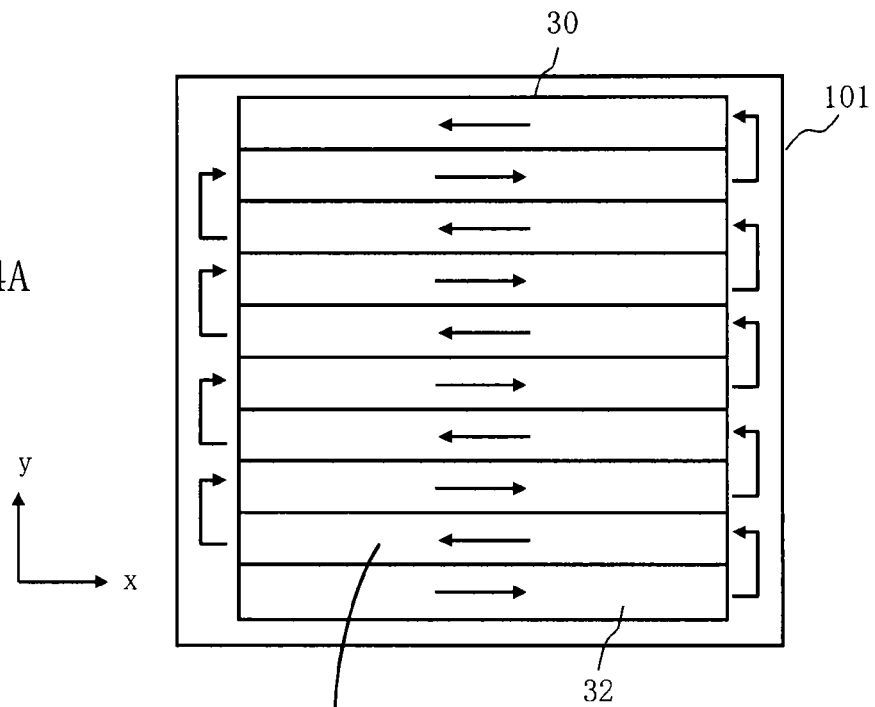
FIGS. 4A to 4C are schematic diagrams explaining a writing operation according to Embodiment 1.
Figure 4B:
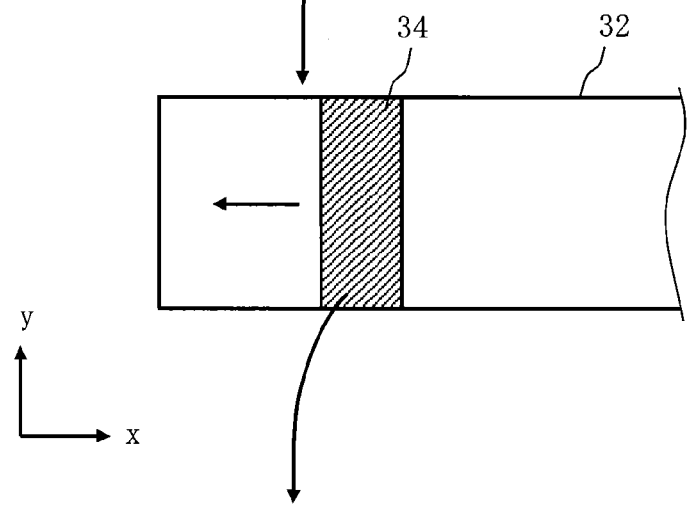
Figure 4C:
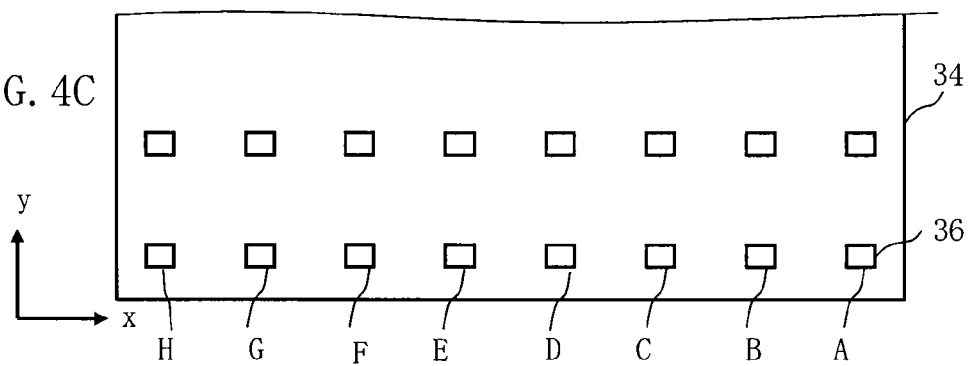

FIGS. 4A to 4C are schematic diagrams explaining a writing operation according to Embodiment 1. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end and located to be relatively in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 4C, a plurality of shot patterns 36 of the same number as the holes 22 are formed at a time by multiple beams which have been formed by passing through respective corresponding holes 22 of the aperture member 203. For example, a beam which passed through one hole A of the aperture member 203 irradiates the position "A" shown in FIG. 4C and forms a shot pattern 36 at this position. Similarly, a beam which passed through one hole B of the aperture member 203 irradiates the position "B" shown in FIG. 4C and forms another shot pattern 36 at this position, for example. Hereafter, a similar operation is performed with respect to C to H. Then, the raster scan method is employed when writing each stripe 32, wherein while the XY stage 105 is moved in the x direction, the deflector 208 performs deflection such that each shot moves (scans) in the y direction or in the x and y directions in order and shot beam radiation is continuously emitted in order.

Figure 5:
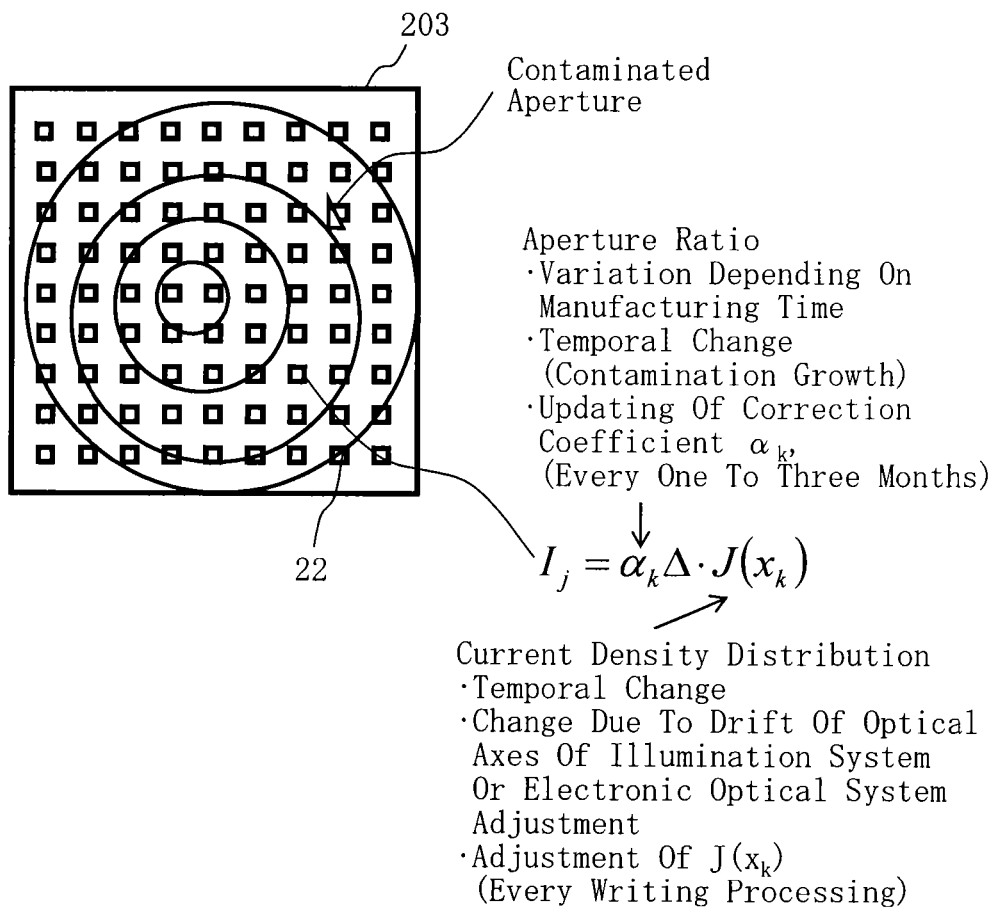
FIG. 5 is a schematic diagram explaining a change of a current amount of multiple beams according to Embodiment 1.

FIG. 5 is a schematic diagram explaining a change of the current amount of multiple beams according to Embodiment 1. In FIG. 5, the change of the current amount of each beam of the multiple beams is mainly caused by change of the current density due to a temporal change of the cathode in the electron gun assembly 201, or caused by variation or change of the open area (aperture ratio) of the hole 22 of the aperture member 203 which forms multiple beams. Particularly, change of the current density due to a temporal change of the cathode may always occur. Therefore, it is necessary to measure the current density every several days or every writing processing in order to calibrate the beam current to correspond to the change. On the other hand, variation of the open area (aperture ratio) of the hole 22 of the aperture member 203 depends on the manufacturing time, and change of the open area (aperture ratio) is generated from adhesion of contamination etc., and grows during the period from several weeks to several months. According to Embodiment 1, in order to efficiently reflect these causes having different occurrence periods, a correction coefficient $\alpha_k$ and a polynomial function $J(x_k)$ of a beam current for reflecting both the effects are generated. Then, the correction coefficient $\alpha_k$ and the polynomial function $J(x_k)$ are updated at respective intervals of the two causes whose occurrence time are different from each other. According to Embodiment 1, concerning the change of the current density, a beam group current $I_j$ is measured at intervals of one day or one week, and reflected to the polynomial function $J(x_k)$. Alternatively, it is measured at each writing processing and reflected to the polynomial function $J(x_k)$. Concerning the change of the open area (aperture ratio), an individual beam current $i_k$ is measured every one to three month(s), and reflected to the correction coefficient $\alpha_k$. An irradiation time $t_k$ which determines a dose is calculated using the correction coefficient $\alpha_k$ and the polynomial function $J(x_k)$ which have been updated at respective intervals. Hereafter, it will be described in detail.

Figure 6:
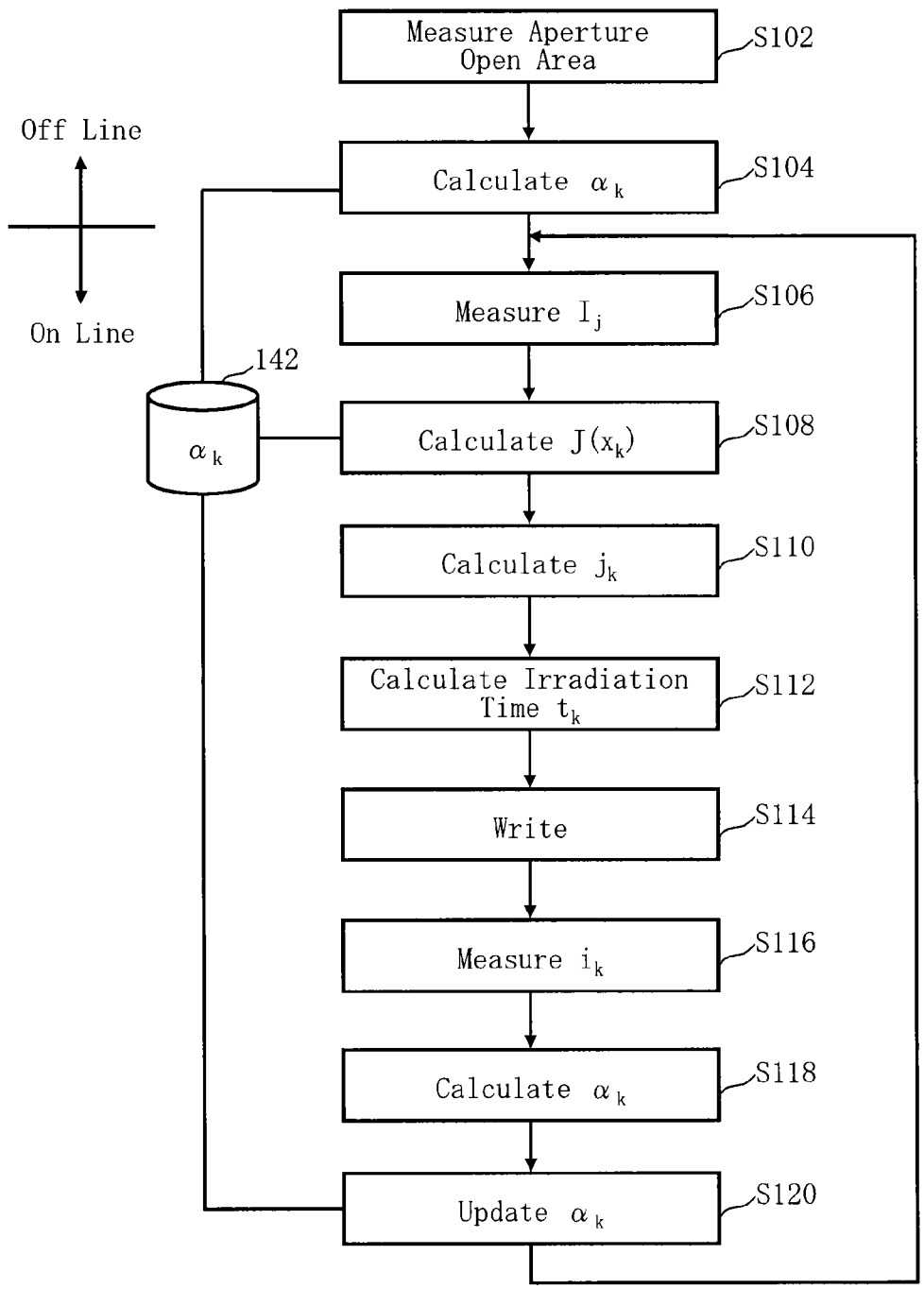
FIG. 6 is a flowchart showing main steps of a writing method according to Embodiment 1.

FIG. 6 is a flowchart showing main steps of a writing method according to Embodiment 1. In FIG. 6, the writing method according to Embodiment 1 executes a series of steps: an aperture open area measurement step (S102), a correction coefficient $\alpha_k$ initial value calculation step (S104), a beam group current $I_j$ measurement step (S106), a function $J(x_k)$ calculation step (S108), a current density $j_k$ calculation step (S110), a writing time $t_k$ calculation step (S112), a writing step (S114), an individual beam current $i_k$ measurement step (S116), a correction coefficient $\alpha_k$ calculation step (S118), and a correction coefficient $\alpha_k$ updating step (S120).

In the aperture open area measurement step (S102), an open area $S_k$ of an opening for forming each beam of multiple beams is calculated based on an image obtained by capturing each hole 22 of the aperture member 203 by using a scanning electron microscope (SEM). Alternatively, an open area $S_k$ of an opening for forming each beam of multiple beams is calculated by irradiating each hole 22 of the aperture member 203 with laser radiation by using a transmission light amount of laser for each hole 22. This area reflects variation depending on the manufacturing time of the aperture member 203. Hereafter, k denotes an individual beam identification number or coordinates (vector).

In the correction coefficient $\alpha_k$ initial value calculation step (S104), an initial value of the correction coefficient $\alpha_k$ is obtained by dividing each calculated open area $S_k$ of the hole 22 of the aperture member 203 by an open area $\Delta$ of a design value. $\alpha_k = S_k/\Delta$ serves as an initial value. The obtained initial value of the correction coefficient $\alpha_k$ of each beam is stored in the storage device 142.

In advance, multiple beams, which respectively have passed through a corresponding hole of a plurality of holes 22 of the aperture member 203, are separated into a plurality of beam groups, each being per region of a plurality of regions which are obtained by dividing a multi-beam formation region.

In the beam group current $I_j$ measurement step (S106), the beam group current measurement unit 50 measures a current value $I_j$ of a beam group of each region. It is preferable to measure a current value $I_j$ of a beam group of each region before starting the writing, at each writing processing.

Figure 7:
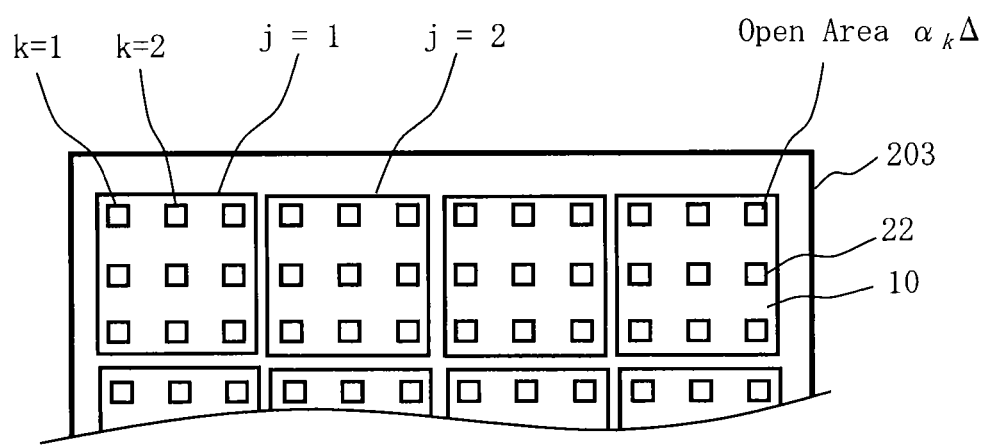
FIG. 7 is a schematic diagram explaining a method of generating a beam group according to Embodiment 1.

FIG. 7 is a schematic diagram explaining a method of generating a beam group according to Embodiment 1. In FIG. 7, a multi-beam formation region of the aperture member 203 is divided into a plurality of mesh regions 10. In the example of FIG. 7, it is divided into mesh regions 10 where the number of beams in each region is 3×3, for example. It is more preferable to divide the multi-beam formation region of the aperture member 203 into mesh regions 10 where the number of beams in each region is 10×10, for example. Although the case of FIGS. 2A and 2B in which the holes 22 of 512 (rows)×8 (columns) are formed in a matrix has been shown, it is also preferable to form the holes 22 of 512×512 in a matrix, for example. Alternatively, multiple beams more than 512× 512 or multiple beams less than 512×8 may be formed. Hereafter, j denotes an identification number or coordinates (vector) of a beam group (or the mesh region 10).

Figure 8:
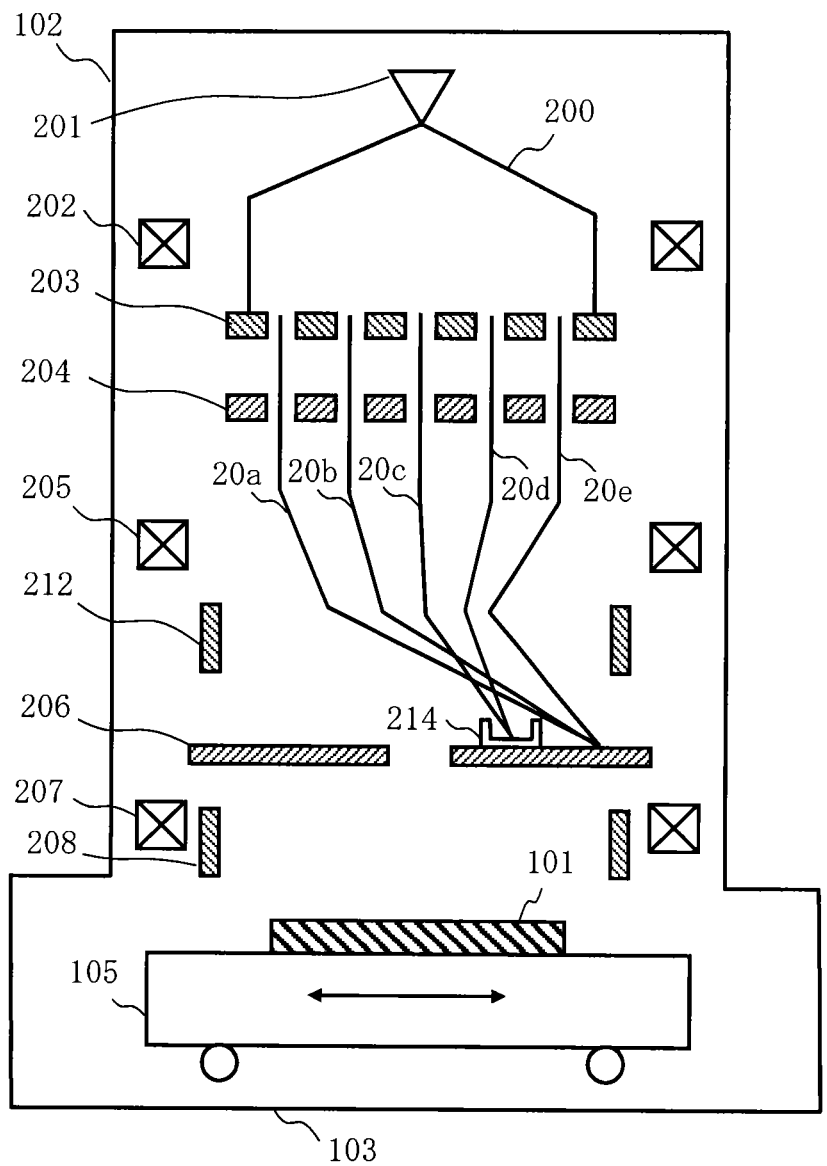
FIG. 8 is a schematic diagram explaining a method of measuring a beam group current according to Embodiment 1.

FIG. 8 is a schematic diagram explaining a method of measuring a beam group current according to Embodiment 1. The blanker in the blanking plate 204 performs deflection so that only the beam group (for example, a beam group of 10×10 beams) in the mesh region being a measurement object in all the electron beams (multi-beam) 20a to 20e which have been formed by respectively passing through a corresponding hole of a plurality of holes 22 of the aperture member 203 may be in the "beam on" state and the other beams may be in the "beam off" state. Thus, what is necessary for the deflector 212 is to collectively deflect all the beams, using a deflection amount by which only the beam group (for example, a beam group of 10×10 beams) being in the on state irradiates the current detector 214. Thereby, the current detector 214 can be irradiated only with the object beam group in the target mesh region. Therefore, the current detector 214 can detect a current value of all the beams in the on state in the multiple beams. The remaining beams are blocked by the limiting aperture member 206. Accordingly, the beams are blocked before reaching the writing chamber 103. Thus, the beams never reach the stage 105 and the target object 101. Data measured by the current detector 214 is converted to a digital signal by the amplifier 138, and output to the beam group current measurement unit 50. Thereby, the beam group current measurement unit 50 can measure a beam group current $I_j$ of the target mesh region. This operation described above is executed for all the mesh regions 10. Thus, a beam group current $I_j$ of each beam group (each mesh region) can be measured.

In the function $J(x_k)$ calculation step (S108), the function $J(x_k)$ calculation unit 52 calculates a function $J(x_k)$ by using a correction coefficient $\alpha_k$ which corrects an open area of each hole 22 forming a beam group concerned. The function $J(x_k)$ is a function that minimizes $\Sigma \epsilon_j^2$ which is a sum of squared values $\epsilon_j^2$ of all the beam groups, where each squared value $\epsilon_j^2$ is calculated by squaring a difference $\epsilon_j$ between a current value $I_j$ of the beam group concerned and a sum of products for the beam group concerned, where each of the products is obtained by multiplying an open area $\alpha_k \cdot \Delta$, which has been corrected by the correction coefficient $\alpha_k$, by a function $J(x_k)$ (a predetermined function expression). As for the correction coefficient $\alpha_k$, its newest value is read from the storage device 142. The function $J(x_k)$ calculation unit 52 is an example of a function expression calculation unit. Specifically, the following equation (1) is defined first.

$$\varepsilon_j = I_j - \sum_{k \subset l} \alpha_k \Delta \cdot J(x_k) \tag{1}$$

The function $J(x_k)$ is defined by a polynomial, for example, by the following equation (2), where $x_k = (x, y)$.

$$J(x_k) = a_0 + a_1 x + a_2 y + a_3 x^2 + a_4 xy + a_5 y^2 + a_6 x^3 + a_7 x^2 y + a_8 xy^2 + a_9 y^3 \tag{2}$$

The function $J(x_k)$ is calculated which minimizes a sum of squared values $\varepsilon_j^2$ of all the beam groups, where each squared value $\varepsilon_j^2$ is obtained by squaring a difference $\varepsilon_j$. That is, the function $J(x_k)$ is completed by calculating coefficients a0 to a9 to minimize $\Sigma \varepsilon_j^2$. The newest measured $I_j$ and an initial value of the correction coefficient $\alpha_k$ are used for the function $J(x_k)$. The function $J(x_k)$ is stored in the storage device 142.

In the current density $j_k$ calculation step (S110), the current density calculation unit 54 reads the newest function $J(x_k)$ and correction coefficient $\alpha_k$ from the storage device 142, and, by using these, calculates a current density $j_k$ of each beam of multiple beams. The current density $j_k$ can be defined by a product of the function $J(x_k)$ and the correction coefficient $\alpha_k$. Therefore, the current density $j_k$ for correcting an individual beam current can be obtained.

In the writing time $t_k$ calculation step (S112), the writing time calculation unit 56 calculates an irradiation time $t_k$ of a beam for each beam shot. The irradiation time $t_k$ of a beam can be defined by a value obtained by dividing a dose D by a current density $j_k$.

In the writing step (S114), the writing processing unit 58 controls writing processing to write a pattern on the target object 101 with the multi-beam 20. Specifically, the writing processing is performed as follows: For each stripe region 32, the writing data processing unit 60 controlled by the writing processing unit 58 reads writing data from the storage device 140, and performs data conversion processing of a plurality of steps to generate shot data unique to the apparatus.

The deflection control circuit 130 generates a signal for blanking control of a shot concerned to be performed by each blanker, for a shot, based on the shot data, and the signal is amplified by the DAC amplifier 134 and converted from a digital to an analog signal to be output to each blanker.

The deflection control circuit 132 calculates deflection amounts in the x and y directions of each shot, and generates a signal for deflection. Then, the signal is amplified by the DAC amplifier 136 and converted from a digital to an analog signal to be output to the deflector 208.

The writing unit 150 writes a pattern on each stripe region 32 of the target object 101 by irradiation of each beam based on a calculated irradiation time $t_k$. Since the irradiation time $t_k$ has been corrected for each beam, it is possible to correct a beam current $i_k$ for each beam.

In the individual beam current $i_k$ measurement step (S116), the individual beam current measurement unit 62 measures a current value $i_k$ of each beam of the multiple beams during between writing processing. Specifically, it operates as described below. The current value $i_k$ of each beam of multiple beams is measured at intervals of obtaining individual beam current values $i_k$ of all the beams, in the period during which writing processing is performed for a plurality of target objects.

Figure 9:
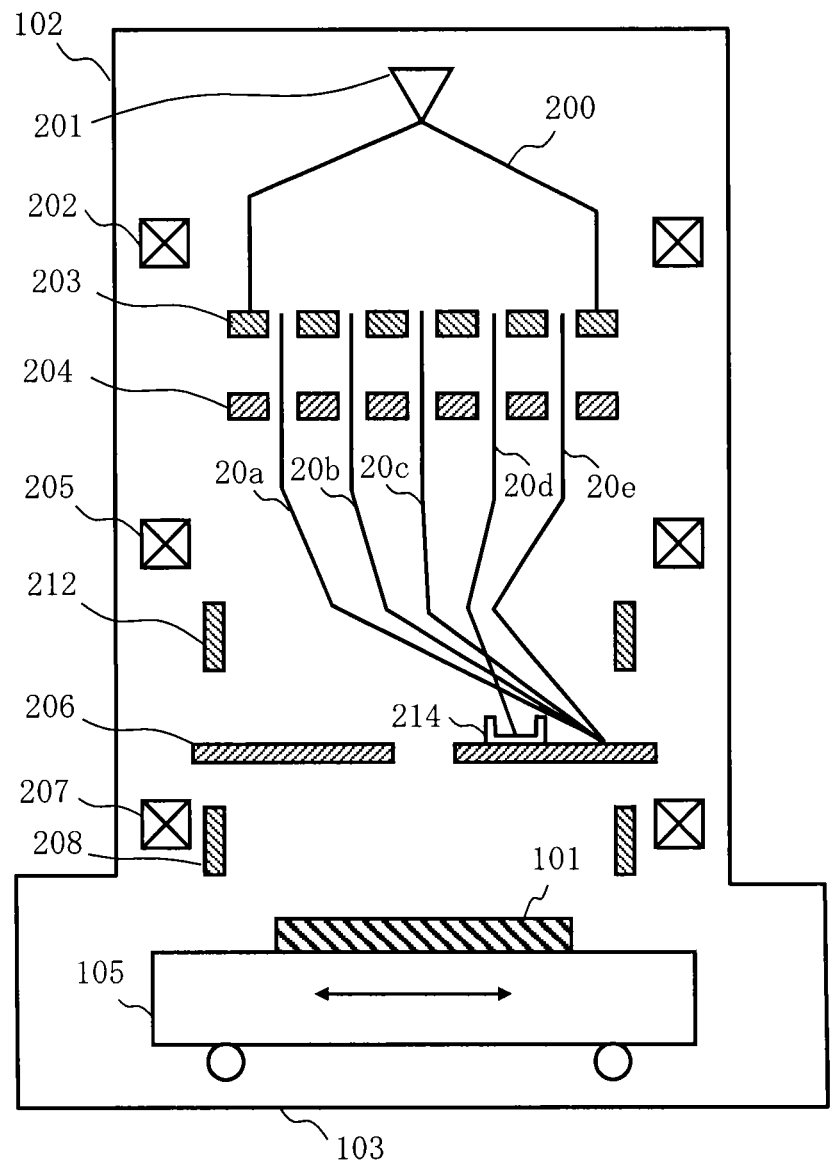
FIG. 9 is a schematic diagram explaining a method of measuring an individual beam current according to Embodiment 1.

FIG. 9 is a schematic diagram explaining a method of measuring an individual beam current according to Embodiment 1. The blanker in the blanking plate 204 performs deflection so that only the beam(s) being a measurement object may be in the on state and other beams may be in the off state. Thus, what is necessary for the deflector 212 is to collectively deflect all the beams, using a deflection amount by which only the beam(s) in the on state can irradiate the current detector 214. Thereby, it is possible to irradiate the current detector 214 only with the object beam 20d. Therefore, the current detector 214 can detect a current value of all the beams (in this case, one beam) in the on state in the multiple beams. The remaining beams are blocked by the limiting aperture member 206. Accordingly, the beams are blocked before reaching the writing chamber 103. Thus, the beams never reach the stage 105 and the target object 101. Data measured by the current detector 214 is converted to a digital signal by the amplifier 138, and output to the individual beam current measurement unit 62. Thereby, the individual beam current ($i_k$) measurement unit 62 can measure a current $i_k$ of the object beam. This operation described above is executed for all the beams. Thereby, the beam current $i_k$ of each beam can be measured. However, the current value $i_k$ of each beam is measured at the time of transferring the target object 101 or moving between a plurality of stripe regions 32. That is, not all the individual beam current values $i_k$ are measured at a time, but an individual beam current value $i_k$ of each beam is measured in order while performing writing processing, during the time in which the target object is not actually irradiated with beams, such as a time of transferring the target object or moving between stripes. For example, all the individual beam current values $i_k$ are measured within one to three months. Thereby, it is possible to overlap the time period of transferring the target object or moving between stripes, etc., with the time period of measuring an individual beam current value $i_k$, which prevents reduction of the throughput. Alternatively, it is also preferable to measure all the individual beam current values $i_k$ several times within one to three months. Then, what is necessary is just to store the newest data of the measured individual beam current value $i_k$ in the storage device 142.

According to Embodiment 1, when measuring beam currents, since beams are blocked before reaching the writing chamber 103, it is possible to freely perform transferring the target object to the stage or moving the stage. Thereby, it is also possible to overlap the time period during processing on the stage, such as transferring the target object to the stage or measuring height distribution of the target object 101 or the time period during an operation performed with moving the stage, with the time period of measuring an individual beam current value $i_k$, which further prevents reduction the throughput.

In the correction coefficient $\alpha_k$ calculation step (S118), the correction coefficient calculation unit 64 calculates a correction coefficient $\alpha_k$ which corrects an open area of the hole 22 forming a beam concerned by using a function $J(x_k)$ and a current value $i_k$ of the beam concerned, for each beam of the multiple beams. The correction coefficient $\alpha_k$ is defined by the following equation (3).

$$\alpha_k = \frac{i_k}{\Delta \cdot J(x_k)} \quad (3)$$

In the correction coefficient $\alpha_k$ updating step (S120), the updating unit 66 updates a correction coefficient $\alpha_k$ for the beams concerned, for each beam of the multiple beams. Specifically, it is only necessary to perform updating by rewriting the correction coefficient $\alpha_k$ stored in the storage device 142. The updating of the correction coefficient $\alpha_k$ is performed at intervals of about one to three months.

In the case of measuring all the individual beam current values $i_k$ within one to three months, the correction coefficient $\alpha_k$ may be calculated and updated after all the individual beam current values $i_k$ have been measured. In the case of measuring all the individual beam current values $i_k$ several times during from one to three months, the correction coefficient $\alpha_k$ may be calculated and updated by using all the newest individual beam current values $i_k$ which are finally obtained after one to three months. Alternatively, it is also preferable to calculate the correction coefficient $\alpha_k$ at each of the several times of measuring all the individual beam current values $i_k$, and to perform updating by using the newest calculated correction coefficient $\alpha_k$ which is finally obtained after one to three months.

Figure 10:
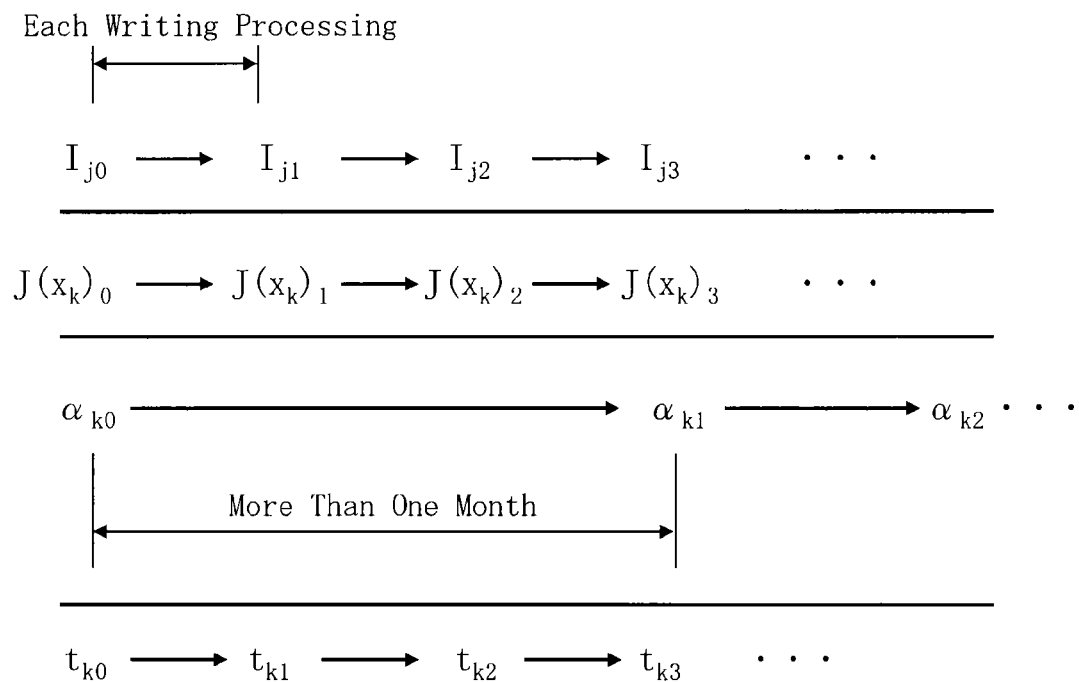
FIG. 10 illustrates intervals of calibrating an individual beam current amount according to Embodiment 1.

FIG. 10 illustrates intervals of calibrating an individual beam current amount according to Embodiment 1. As shown in FIG. 10, since the current value $I_j$ of each beam group is measured at each writing processing, the function $J(x_k)$ is updated each time and the writing time $t_k$ of each beam is also corrected (calibrated) each time. Therefore, it is possible to calibrate an individual beam current amount while considering change of a current density of the multiple beams, at each writing processing. Furthermore, since the correction coefficient $\alpha_k$ is updated at intervals of one month or more, the function $J(x_k)$ and the writing period $t_k$ of each beam are also corrected (calibrated) at each updating time. Therefore, it is possible to calibrate the individual beam current amount while considering change of an open area at intervals of one month or more.

As described above, according to Embodiment 1, factors which change the current amount of an individual beam at different intervals can be measured at the optimum frequencies and included in the correction. Therefore, it is possible to minimize the measuring time while maintaining required correction precision. As a result, a current amount of each beam of multiple beams can be calibrated while the change time of occurrence factors is taken into consideration without reducing the throughput.

An embodiment has been explained referring to concrete examples described above. However, the present invention is not limited to these specific examples. The raster scanning operation described above is just an example, and it is also acceptable to use other operation method instead of the raster scanning operation using multiple beams.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
    a beam group current measurement unit configured to measure a current value of each beam group of a plurality of beam groups, where the each beam group is per region of a plurality of regions obtained by dividing a multi-beam formation region, wherein multiple beams, respectively having passed through a corresponding opening of a plurality of openings of an aperture member in which the plurality of openings are provided to form the multiple beams by being irradiated with a charged particle beam, are separated into the plurality of beam groups;
    a function expression calculation unit configured to calculate a predetermined function expression by using a correction coefficient that corrects an open area of each opening for forming a beam group concerned of the plurality of beam groups, wherein the predetermined function expression minimizes a sum of squared values of all the plurality of beam groups, where each of the squared values is calculated by squaring a difference between the current value of the beam group concerned and a sum of products for the beam group concerned, where each of the products is obtained by multiplying the open area having been corrected by the correction coefficient for the each opening for forming the beam group concerned by the predetermined function expression;
    an individual beam current value measurement unit configured to measure a current value of each beam of the multiple beams during between writing processing;
    a correction coefficient calculation unit configured to calculate the correction coefficient that corrects the open area of the each opening for forming a beam concerned of the multiple beams by using the predetermined function expression and the current value of the beam concerned, for the each beam of the multiple beams;
    an updating unit configured to update the correction coefficient for the beam concerned, for the each beam of the multiple beams;
    a current density calculation unit configured to calculate a current density of the each beam of the multiple beams by using the predetermined function expression;
    an irradiation time calculation unit configured to calculate an irradiation time of the each beam by using the current density of the each beam; and
    a writing unit configured to write a pattern on a target object by irradiating the each beam during the irradiation time calculated.

2. The apparatus according to claim 1,
    wherein the current value of the each beam group is measured at each writing processing or during between writing processing for a plurality of target objects, and
    the current value of the each beam of the multiple beams is measured at a frequency by which beam current values of all the beams of the multiple beams can be obtained in a period during which writing processing is performed for a plurality of target objects.

3. The apparatus according to claim 2, wherein the period is set to be greater than or equal to one month.

4. The apparatus according to claim 1, wherein an initial value of the correction coefficient for the each beam is obtained by dividing the open area of the each opening in the plurality of openings by an open area of a design value.

5. The apparatus according to claim 4, wherein each open area of each opening of the plurality of openings is measured from an image captured by using a scanning electron microscope (SEM).

6. The apparatus according to claim 4, further comprising: a storage device configured to store the initial value of the correction coefficient.

7. A multi charged particle beam writing method comprising:

measuring a current value of each beam group of a plurality of beam groups, where the each beam group is per region of a plurality of regions obtained by dividing a multi-beam formation region, wherein multiple beams, respectively having passed through a corresponding opening of a plurality of openings of an aperture member in which the plurality of openings are provided to form the multiple beams by being irradiated with a charged particle beam, are separated into the plurality of beam groups;

calculating a predetermined function expression by using a correction coefficient that corrects an open area of each opening for forming a beam group concerned of the plurality of beam groups, wherein the predetermined function expression minimizes a sum of squared values of all the plurality of beam groups, where each of the squared values is calculated by squaring a difference between the current value of the beam group concerned and a sum of products for the beam group concerned, where each of the products is obtained by multiplying the open area having been corrected by the correction coefficient for the each opening for forming the beam group concerned by the predetermined function expression;

calculating a current density of the each beam of the multiple beams by using the predetermined function expression;

calculating an irradiation time of the each beam by using the current density of the each beam;

writing a pattern on a target object by irradiating the each beam during the irradiation time calculated;

measuring a current value of each beam of the multiple beams during between writing processing;

calculating a correction coefficient that corrects an open area of each opening for forming a beam concerned of the multiple beams by using the predetermined function expression and the current value of the beam concerned, for the each beam of the multiple beams; and updating the correction coefficient for the beam concerned, for the each beam of the multiple beams.

8. The method according to claim 7, wherein an initial value of the correction coefficient for the each beam is calculated using an image obtained by capturing the each opening for forming the beam concerned with a scanning electron microscope (SEM), or using a transmission light amount obtained by irradiating a laser to the each opening for forming the beam concerned.

9. The method according to claim 7, wherein an initial value of the correction coefficient for the each beam is obtained by dividing the open area of the each opening in the plurality of openings by an open area of a design value.

10. The method according to claim 9, wherein the open area of the each opening of the plurality of openings is measured from an image captured with a scanning electron microscope.

* * * * *